(12) United States Patent
Yun et al.

(10) Patent No.: US 8,138,812 B2
(45) Date of Patent: Mar. 20, 2012

(54) DEVICE FOR GENERATING CLOCK IN SEMICONDUCTOR INTEGRATED CIRCUIT

(75) Inventors: Won Joo Yun, Ichon-si (KR); Hyun Woo Lee, Ichon-si (KR); Ki Han Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 28 days.

(21) Appl. No.: 12/646,608

(22) Filed: Dec. 23, 2009

(65) Prior Publication Data
US 2011/0025384 A1 Feb. 3, 2011

(30) Foreign Application Priority Data

Jul. 31, 2009 (KR) .................... 10-2009-0070733

(51) Int. Cl.
*G06F 1/04* (2006.01)
(52) U.S. Cl. ......... 327/293; 327/295; 327/296; 327/165
(58) Field of Classification Search .................. 327/291, 327/293, 295–298, 141, 144, 165–166, 171
See application file for complete search history.

(56) References Cited

U.S. PATENT DOCUMENTS

| | | | |
|---|---|---|---|
| 6,442,225 B1 | 8/2002 | Huang | |
| 6,597,235 B2 | 7/2003 | Choi | |
| 6,859,079 B2 | 2/2005 | Haraguchi et al. | |
| 6,940,782 B2 | 9/2005 | Matsui | |
| 7,009,434 B2 | 3/2006 | Lee | |
| 7,119,598 B2 * | 10/2006 | Saeki | 327/293 |
| 7,224,639 B2 | 5/2007 | Lee | |
| 7,317,343 B1 * | 1/2008 | De La Cruz et al. | 327/295 |
| 7,577,056 B2 | 8/2009 | Hsu | |
| 7,863,957 B2 * | 1/2011 | Jang et al. | 327/175 |
| 2006/0222131 A1 | 10/2006 | Park | |

FOREIGN PATENT DOCUMENTS

| | | |
|---|---|---|
| JP | 2009-071594 | 4/2009 |
| KR | 10-2008-0023496 A | 3/2008 |

\* cited by examiner

*Primary Examiner* — An Luu
(74) *Attorney, Agent, or Firm* — William Park & Associates Ltd.

(57) ABSTRACT

Various embodiments of a semiconductor integrated circuit. According to one exemplary embodiment, a semiconductor integrated circuit includes a multi-phase clock generator that is configured to generate a multi-phase internal clock; a first edge combining unit that is configured to generate a first output clock having a first frequency by combining rising edges of clocks included in the internal clock, and transmit the first output clock to a first port; and a second edge combining unit that is configured to generate a second output clock having a second frequency by combining rising edges of clocks included in the internal clock, and transmit the output clock to a second port.

13 Claims, 6 Drawing Sheets

2121

DEVICE FOR GENERATING CLOCK IN SEMICONDUCTOR INTEGRATED CIRCUIT

CROSS-REFERENCE TO RELATED PATENT APPLICATION

The present application claims priority under 35 U.S.C 119(a) to Korean Application No. 10-2009-0070733, filed on Jul. 31, 2009, in the Korean Intellectual Property Office, which is incorporated herein by reference in its entirety as if set forth in full.

BACKGROUND

1. Technical Field

Various embodiments of the present disclosure described herein generally relate to a semiconductor integrated circuit, and more particularly, to a device for generating a clock in a semiconductor integrated circuit.

2. Related Art

In general, the activation speed of semiconductor integrated circuits has been improved by activating the semiconductor integrated circuits using clocks. To increase activation speed, semiconductor integrated circuits are provided with a clock buffer and use an external clock input after buffering. In some cases, the semiconductor integrated circuits generate and use, by themselves, an internal clock that has been corrected in the phase difference from an external clock by a clock generator, such as a DLL (Delay Locked Loop) circuit or a PLL (Phase. Locked Loop) circuit.

Currently, the activation speed of semiconductor integrated circuits gradually increases, and accordingly, conventional semiconductor integrated circuits synchronize data with each phase by dividing a phase of an internal clock into several phases to generate a multi-phase internal clock. Accordingly, the internal clock is implemented as a set of a plurality of clocks with a predetermined phase difference.

More recently, a plurality of channels for transmitting signals between semiconductor integrated circuits have been provided, in which the channels may be activated in different frequency domains. However, each channel is typically provided with a clock generator to accomplish the operation. As a result, this deteriorates both an area margin and power efficiency of the semiconductor integrated circuits.

Furthermore, typical semiconductor integrated circuits generate a clock by combining rising edges of the clocks included in a multi-phase internal clock; however, this configuration is problematic because the frequency band is limited to implementing a low-frequency operation mode. Typical semiconductor integrated circuits are required to lower the frequency of each clock before combining the rising edges of the clocks in the low-frequency operation mode because there is a certain limit in lowering the frequency of the clocks.

As described above, since a clock generator should usually be provided for each channel in semiconductor integrated circuits, efficient application was difficult in terms of area and power and it was difficult to implement an appropriate operation at the low-frequency operation mode. Therefore, it is desirable to have an improved device for generating a clock that achieves high integration and low power consumption in a semiconductor integrated circuit.

SUMMARY OF THE INVENTION

In order to overcome the above problems and to attain the advantages and in accordance with the purposes of the invention, as embodied and broadly described herein, various embodiment of the present invention may provide a device for generating a clock in a semiconductor integrated circuit that can overcome a frequency band limit.

According to one aspect, a device for generating a clock in a semiconductor integrated circuit may comprise: a multi-phase clock generator that generates a multi-phase internal clock; a first edge combining unit that is configured to generate a first output clock having a first frequency by combining rising edges of clocks included in the internal clock, and transmit the first output clock to a first port; and a second edge combining unit that is configured to generate a second output clock having a second frequency by combining rising edges of clocks included in the internal clock, and transmit the second output clock to a second port.

According to another aspect, a device for generating a clock in a semiconductor integrated circuit may comprise: a rising pulse extracting unit that is configured to generate a plurality of rising pulse extraction signals toggled to a high level at the rising edges of a portion of pre-assigned clocks among clocks included in a multi-phase internal clock; a falling pulse extracting unit that is configured to generate a plurality of falling pulse extraction signals toggled to a low level at the rising edge of a portion of pre-assigned clocks among clocks included in the multi-phase internal clock; a MUX unit that is configured to generate a plurality of rising pulse signals and a plurality of falling pulse signals by combining the plurality of rising pulse extraction signals and the plurality of falling pulse extraction signals; and a clock generating unit that is configured to generate an output clock in response to the plurality of rising pulse signals and the plurality of falling pulse signals.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
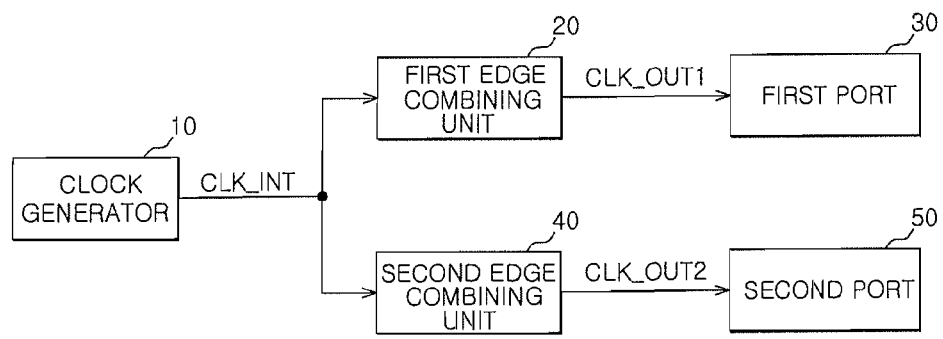
FIG. 1 is a block diagram illustrating an exemplary configuration of a device for generating a clock in a semiconductor integrated circuit according to an embodiment of the present invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram illustrating an exemplary configuration of a device for generating a clock in a semiconductor integrated circuit according to one embodiment of the present invention.

As illustrated in FIG. 1, a device for generating a clock in a semiconductor integrated circuit according to an exemplary embodiment of the present invention may comprise: a multi-phase clock generator 10 that generates a multi-phase internal clock CLK_INT; a first edge combining unit 20 that generates a first output clock CLK_OUT1 having a first frequency by combining rising edges of clocks included in the internal clock CLK_INT and transmits the first output clock to a first port 30; and a second edge combining unit 40 that generates a second output clock CLK_OUT2 having a second frequency by combining rising edges of clocks included in the internal clock CLK_INT and transmits the second output clock to a second port 50.

The multi-phase clock generator 10 may be implemented by using a multi-phase DLL circuit or a multi-phase PLL circuit. The multi-phase internal clock CLK_INT may be a set of a plurality of clocks having the same phase difference and a set of eight clocks is exemplified hereafter for the convenience of description.

The first edge combining unit 20 extracts a predetermined number of clocks among the clocks included in the multi-phase internal clock CLK_INT and generates the first output clock CLK_OUT1 by combining the rising edges of the extracted clocks. In this exemplary process, the number of clocks that the first edge combining unit 20 extracts depends on the frequency mode. For example, when the first edge combining unit 20 implements an X4-frequency mode (a mode generating a four-times as high frequency), the first edge combining unit 20 extracts all eight clocks from the internal clock CLK_INT to generate the first output clock CLK_OUT1. Alternatively, when the first edge combining unit 20 implements an X2-frequency mode (a mode generating a two-times as high frequency), the first edge combining unit 20 extracts four clocks from the internal clock CLK_INT to generate the first output clock CLK_OUT1. Alternatively, when the first edge combining unit 20 implements an X1-frequency mode (a mode generating the same frequency), the first edge combining unit 20 extracts two clocks from the internal clock CLK_INT to generate the first output clock CLK_OUT1.

The second edge combining unit 40, possibly in the same way as the first edge combining unit 20, extracts a predetermined number of clocks among the docks included in the multi-phase internal clock CLK_INT and generates the second output clock CLK_OUT2 by combining the rising edges of the extracted clocks. By way of example only, the second edge combining unit 20 implements predetermined frequency modes in this manner, however, other frequency modes different from the first edge combining unit 10 may also be implemented.

The first port 30 and the second port 50 may be, for example, terminals for communicating information external to the semiconductor integrated circuit, and the information externally communicated through the first port 30 or the second port 50 may be any one of data, a clock, a data strobe clock DQS, a command, and an address.

The first port 30 and the second port 50 may include an input/output buffer (not shown) and a pad (not shown). When the information is any one of data, data strobe clock, command, and address, the first port 30 and the second port 50 perform buffering in response to each of the first output clock CLK_OUT1 and the second output clock CLK_OUT2 and then output each signal through the pads. Further, when the information is a clock, they buffer the first output clock CLK_OUT1 and the second output clock CLK_OUT2 and then output signals through the pads.

As described above, a device for generating a clock in a semiconductor integrated circuit according to an exemplary embodiment of the present invention may generate output clocks CLK_OUT1 and CLK_OUT2 having each frequency with only one clock generator 10 that generates the multi-phase internal clock CLK_INT.

Furthermore, in a semiconductor integrated circuit that has implemented the X4-frequency mode, the clock generator was required to lower the frequency of the internal clock in order to implement the X2-frequency mode or the X1-frequency mode. However, in a semiconductor integrated circuit according to an exemplary embodiment of the present invention, since the first edge combining unit 20 or the second edge combining unit 40 extract a predetermined number of clocks and generate output clocks CLK_OUT1 and CLK_OUT2 at corresponding frequencies, it does not need to lower the frequency of the internal clock CLK_INT. Therefore, it is possible to generate clocks having various frequencies, regardless of the limit in frequency of the internal clock CLK_INT.

Figure 2:
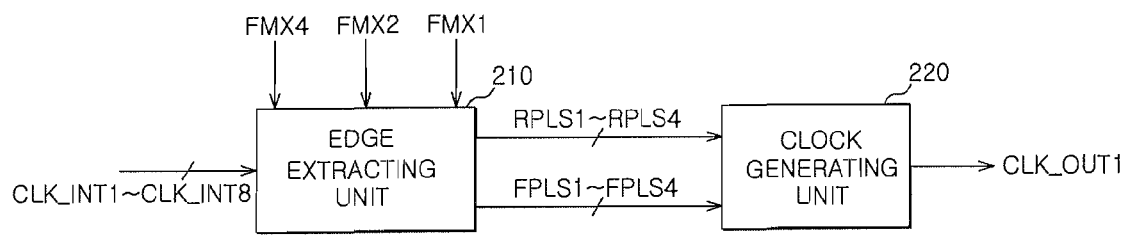
FIG. 2 is a diagram illustrating an exemplary configuration of a first edge combining unit shown in FIG. 1.

FIG. 2 is a diagram illustrating an exemplary configuration of a first edge combining unit shown in FIG. 1, in which the first edge combining unit 20 and the second edge combining unit 40 are formed in the same configuration as described above with reference to the first edge combining unit 20. Hereafter, the eight clocks included in the multi-phase internal clock CLK_INT are represented by eight internal clocks CLK_INT1 to CLKINT8.

As illustrated in FIG. 2, the first edge combining unit 20 may comprise: an edge extracting unit 210 that extracts the rising edges of predetermined clocks from the eight internal clocks CLK_INT1 to CLK_INT8 in response to an X4-frequency mode signal FMX4, an X2-frequency mode signal FMX2, and an X1-frequency mode signal FMX1 and generates four rising pulse signals RPLS1 to RPLS4 and four falling pulse signals FPLS1 to FPLS4; and a clock generating unit 220 that generates the first output clock CLK_OUT1 in response to the four rising pulse signals RPLS1 to RPLS4 and four falling pulse signals FPLS1 to FPLS4.

The operation of the first edge combining unit 20 having the above configuration is described with reference to the timing diagram of FIG. 3.

Figure 3:
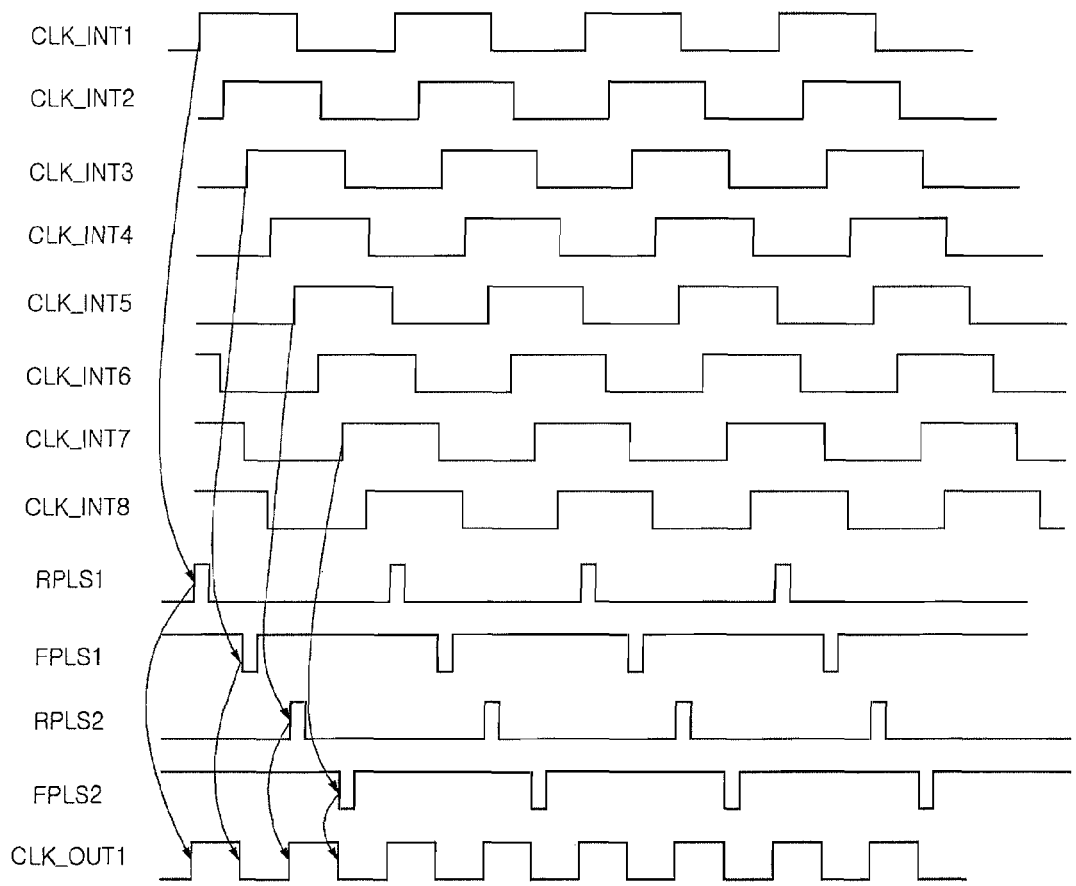
FIG. 3 is a timing diagram illustrating an exemplary operation of the first edge combining unit shown in FIG. 2.

FIG. 3 is a timing diagram illustrating an exemplary operation of the first edge combining unit 20 shown in FIG. 2, when operating in the X2-frequency mode.

As illustrated in FIG. 3, the eight internal clocks CLK_INT1 to CLK_INT8 have the same phase difference.

When the X-2 frequency mode signal FMX2 is enabled, the edge extracting unit 210 activates the first and second rising pulse signals RPLS1 and RPLS2 and the first and second falling pulse signals FPLS1 and FPLS2, using the first, third, fifth, and seventh internal clocks CLK_INT1, CLK_INT3, CLK_INT5, and CLK_INT7 from the eight internal clocks CLK_INT1 to CLK_INT8. In this process, the first and second rising pulse signals RPLS1 and RPLS2 and the first and second falling pulse signals FPLS1 and FPLS2 are activated such that one rising pulse signal and one falling pulse signal are alternately toggled, and have a difference in toggle timing as much as the phase difference of the first, third, fifth, and seventh internal clocks CLK_INT1, CLK_INT3, CLK_INT5, and CLK_INT7. Though not shown, in this process, the third and fourth rising pulse signals RPLS3 and RPLS4 and the third and fourth falling pulse signals FPLS3 and FPLS4 are inactivated and have an insignificant level.

Subsequently, the clock generating unit 220 generates a rising edge of the first output clock CLK_OUT1 in response to the rising pulse signals in the first and second rising pulse signals RPLS1 and RPLS2 and the first and second falling pulse signals FPLS1 and FPLS2, and generates a falling edge of the first output clock CLK_OUT1 in response to the falling pulse signal. Accordingly, the first output clock CLK_OUT1 is implemented as a clock having a frequency two times as much as the first internal clock CLK_INT1.

Though not shown, it is to be understood that the first edge combining unit 20 may be operated using the X4-frequency mode signal FMX4, the X1-frequency mode signal FMX1 or other enabled signal.

When the X4-frequency mode signal FMX4 is enabled, the edge extracting unit 210 generates four rising pulse signals RPLS1 to RPLS4 and four falling pulse signals FPLS1 to FPLS4, using all of the eight internal clocks CLK_INT1 to CLK_INT8, in which all of the four rising pulse signals RPLS1 and RPLS4 and the four falling pulse signals FPLS1 and FPLS4 are activated. In this process, the four rising pulse signals RPLS1 and RPLS4 and the four falling pulse signals FPLS1 and FPLS4 are activated such that one rising pulse signal and one falling pulse signal are alternately toggled, and have a difference in toggle timing as much as the phase difference of the eight internal clocks CLK_INT1 to CLK_INT8.

Further, the clock generating unit 220 generates the first output clock CLK_OUT1 in response to the rising pulse signals in the four rising pulse signals RPLS1 and RPLS4 and the four falling pulse signals FPLS1 and FPLS4, and generates a falling edge of the first output clock CLK_OUT1 in response to the falling pulse signals. Accordingly, the first output clock CLK_OUT1 is implemented as a clock having a frequency four times the first internal clock CLK_INT1.

Further, when the X1-frequency mode signal FMX1 is enabled, the edge extracting unit 210 activates the first rising pulse signal RPLS1 and the first falling pulse signal FPLS1, using only the first and fifth internal clocks CLK_INT1 and CLK_INT5. In this process, the first rising pulse signal RPLS1 and the first falling pulse signal FPLS1 are activated to be alternately toggled and have a difference in toggle timing as much as the phase difference of the first internal clock CLK_INT and the fifth internal clock CLK_INT5. In this process, the second to fourth rising pulse signals RPLS2 to RPLS4 and the second to fourth falling pulse signals FPLS2 to FPLS4 are inactivated and have an insignificant level.

Further, the clock generating unit 220 generates a rising edge of the first output clock CLK_OUT1 in response to the first rising pulse signal RPLS1 and generates a falling edge of the first output clock CLK_OUT1 in response to the first falling pulse signal FPLS1. In this process, the first output clock CLK_OUT1 is implemented as a clock having the same frequency as the first internal clock CLK_INT1.

That is, the first edge combining unit 20 extracts a predetermined number of clocks, based on the frequency mode, from the eight internal docks CLK_INT1 to CLK_INT8, and generates the four rising pulse signals RPLS1 to RPLS4 and the four falling pulse signals FPLS1 to FPLS4. In this process, pulse signals as many as the number of clocks extracted in the frequency mode are activated, in the rising pulse signals RPLS1 to RPLS4 and the falling pulse signals FPLS1 to FPLS4. Subsequently, the edge combining unit 20 generates a rising edge and a falling edge of the first output clock CLK_OUT1, using the activated pulse signals, thereby generating the first output clock CLK_OUT1 having a frequency defined by the frequency mode.

Meanwhile, although it was exemplified herein that eight clocks are included in the internal clock CLK_INT, a different number of clocks may be used and the first edge combining unit 20 and the second edge combining unit 40 may generate clocks having different frequencies. The above description relates to the operational principle of the first edge combining unit 20 and the second edge combining unit 40, and the number of clocks and the number of frequencies which can be generated are by way of example only.

Figure 4:
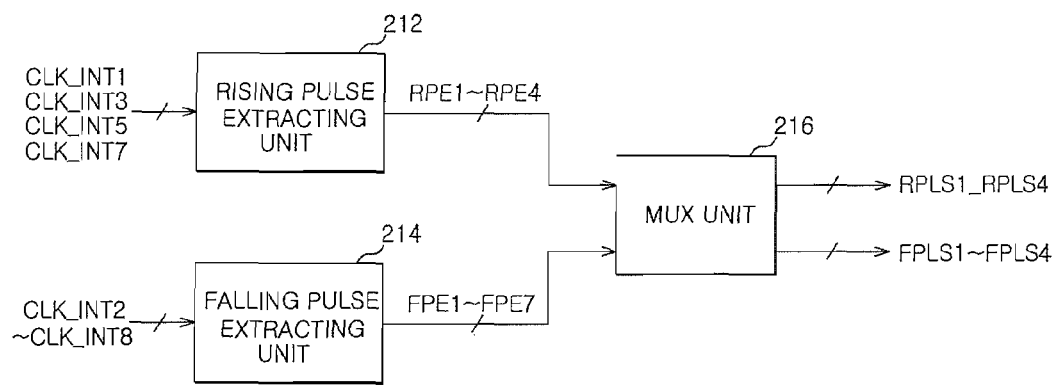
FIG. 4 is a block diagram illustrating an exemplary configuration of the edge extracting unit shown in FIG. 2.

FIG. 4 is a block diagram illustrating an exemplary configuration of the edge extracting unit shown in FIG. 2.

As illustrated in FIG. 4, the edge extracting unit 210 may comprise: a rising pulse extracting unit 212 that generates four rising pulse extraction signals RPE1 to RPE4 toggled to a high level at the rising edge of the first, third, fifth, and seventh internal clocks CLK_INT<1, 3, 5, 7>; a falling pulse extracting unit 214 that generates seven falling pulse extraction signals FPE1 to FPE7 toggled to a low level at the rising edge of the second to eighth internal clocks CLK_INT2 to CLK_INT8; and a MUX unit 216 that generates the four rising pulse signals RPLS1 to RPLS4 and the four falling pulse signals FPLS1 to FPLS4 by combining the four rising pulse extraction signals RPE1 to RPE4 and the seven falling pulse extraction signals FPE1 to FPE7.

The edge extracting unit 210 is described in detail with reference to the diagram showing in detail the configuration of FIG. 5.

Figure 5:
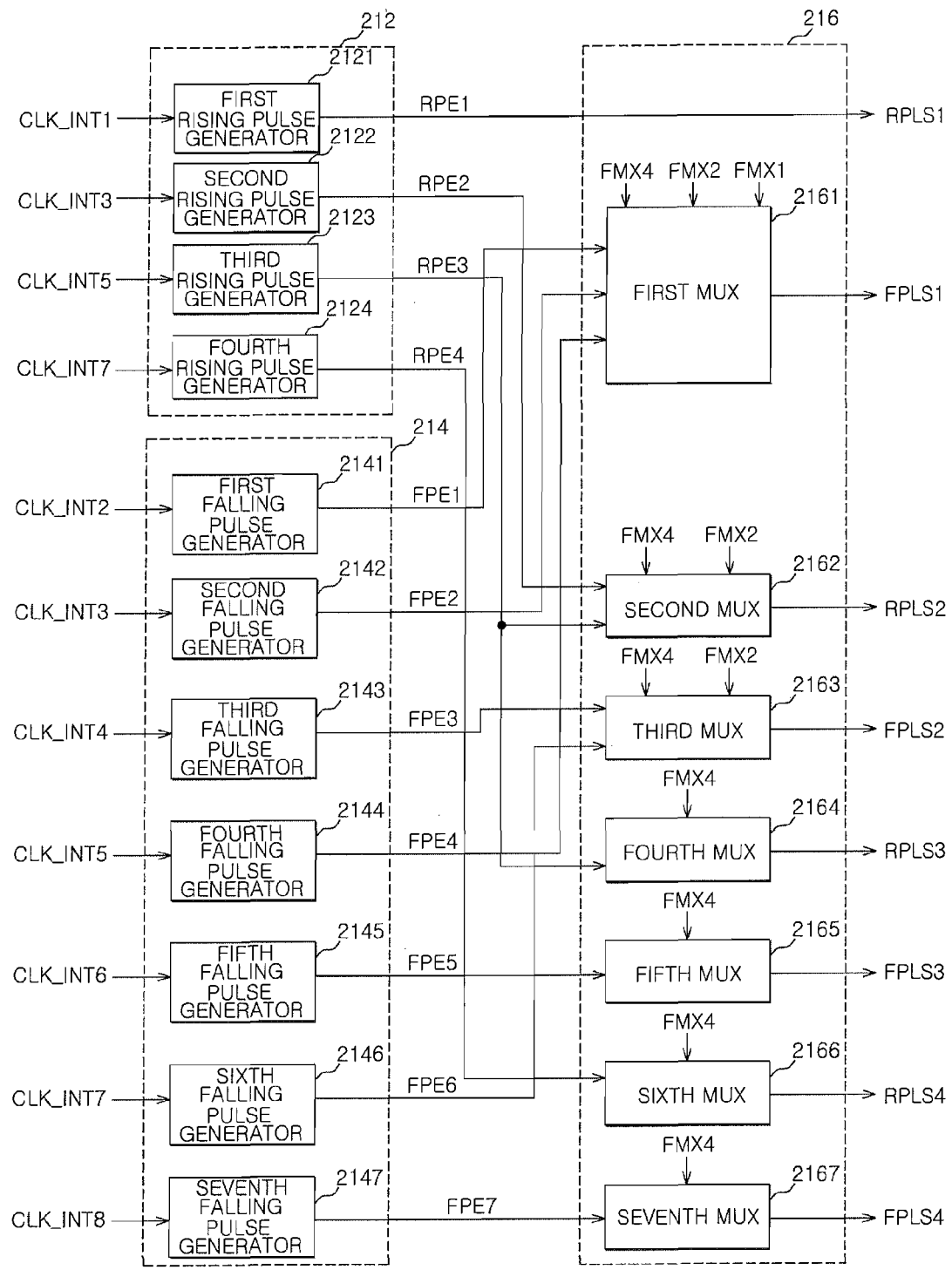
FIG. 5 is a diagram illustrating an exemplary configuration of the edge extracting unit shown in FIG. 4.

FIG. 5 is a diagram illustrating in detail an exemplary configuration of the edge extracting unit shown in FIG. 4.

As illustrated in FIG. 5, the rising pulse extracting unit 212 may comprise four rising pulse generators 2121 to 2124. The four rising pulse generators 2121 to 2124 generate the four rising pulse extraction signals RPE1 to RPE4 toggled at a high level at each of the rising edges of the first, third, fifth, and seventh internal clocks CLK_INT<1, 3, 5, 7>.

The second edge pulse generating unit 214 may comprise seven falling pulse generators 2141 to 2147. The seven falling pulse generators 2141 to 2147 generate the seven falling pulse extraction signals FPE1 to FPE7 toggled to a low level at each of the rising edges of the second to eighth internal clocks CLK_INT2 to CLK_INT8.

The MUX unit 216 may comprise seven MUXs 2161 to 2167. The MUX unit 216 outputs the first rising pulse extraction signal RPE1 as the first rising pulse signal RPLS1.

The first MUX 2161 outputs the first falling pulse extraction signal FPE1 as the first falling pulse signal FPLS1, when the X4-frequency mode signal FMX4 is enabled, outputs the second falling pulse extraction signal FPE2 as the first falling pulse signal FPLS1, when the X2-frequency mode signal FMX2 is enabled, and outputs the fourth falling pulse extraction signal FPE4 as the first falling pulse signal FPLS1, when the X1-frequency mode signal FMX1 is enabled.

The second MUX 2162 outputs the second rising pulse extraction signal RPE2 as the second rising pulse signal RPLS2, when the X4-frequency mode signal FMX4, and outputs the third rising pulse extraction signal RPE3 as the second rising pulse signal RPLS2, when the X2-frequency mode signal FMX2 is enabled. The second MUX 2162 fixes the second rising pulse signal RPLS2 to a low level, when the X4-frequency mode signal FMX4 and the X2-frequency mode signal FMX2 are both disabled.

The third MUX 2163 outputs the third falling pulse extraction signal FPE3 as the second falling pulse signal FPLS2, when the X4-frequency mode FMX4 is enabled, and outputs the sixth falling pulse extraction signal. FPE6 as the second falling pulse signal FPLS2, when the X2-frequency mode signal FMX2 is enabled. The third MUX 2163 fixes the second falling pulse signal FPLS2 to a high level, when the X4-frequency mode signal FMX4 and the X2-frequency mode signal FMX2 are both disabled.

The fourth MUX 2164 outputs the third rising pulse extraction signal RPE3 as the third rising pulse signal RPLS3, when the X4-frequency mode signal FMX4 is enabled. The fourth MUX 2164 fixes the third rising pulse signal RPLS3 to a low level, when the X4-frequency mode FMX4 is disabled.

The fifth MUX 2165 outputs the fifth falling pulse extraction signal FPE5 as the third falling pulse signal FPLS3, when the X4-frequency mode signal FMX4 is enabled. The fifth MUX 2165 fixes the third falling pulse signal FPLS3 to a high level, when the X4-frequency mode signal FMX4 is enabled.

The sixth MUX 2166 outputs the fourth rising pulse extraction signal RPE4 as the fourth rising pulse signal RPLS4, when the X4-frequency mode signal FMX4 is enabled. The sixth MUX 2166 fixes the fourth rising pulse signal RPLS4 to a low level, when the X4-frequency mode signal FMX4 is disabled.

The seventh MUX 2167 outputs the output signal of the seventh falling pulse extraction signal FPE7 as the fourth falling pulse signal FPLS4, when the X4-frequency mode signal FMX4 is enabled. The seventh MUX 2167 fixes the fourth falling pulse signal FPLS4 to a high level, when the X4-frequency mode signal FMX4 is disabled.

In this embodiment, the edge extracting unit 210 activates the four rising pulse signals RPLS1 to RPLS4 and the four falling pulse signal FPLS1 to FPLS4, using all eight internal clocks CLK_INT1 to CLK_INT8, when the X4-frequency mode signal FMX4 is enabled. Further, when the X2-frequency mode signal FMX2 is enabled, the edge extracting unit 210 activates the first and second rising pulse signals RPLS1 and RPLS2 and the first and second falling pulse signals FPLS1FPLS1 and FPLS2, using the first, third, fifth, and seventh internal clocks CLK_INT1, CLK_INT3, CLK_INT5, and CLK_INT7, Further, when the X1-frequency mode signal FMX1 is enabled, the edge extracting unit 210 activates the first rising pulse signal RPLS1 and the first falling pulse signal FPLS1, using the first and fifth internal clocks CLK_INT1 and CLK_INT5.

Figure 6:
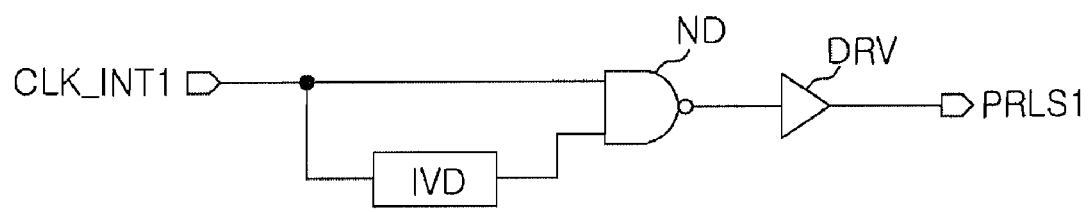
FIG. 6 is a diagram illustrating an exemplary configuration of the first rising-pulse generator shown in FIG. 5.

FIG. 6 is a diagram illustrating in detail an exemplary configuration of the first rising-pulse generator shown in FIG. 5, and as described above with reference to the first rising pulse generator 2121.

As illustrated in FIG. 6, the first rising pulse generator 2121 may comprise an inversion delayer IVD, a NAND gate ND, and a driver DRV. In this embodiment, the first rising pulse signal RPLS1 is toggled to a high level at each rising edge of the first internal clock CLK_INT1CLK_INT1 and the pulse width of the rising pulse RPLS1 is determined by the amount of delay that the inversion delayer IVD has.

According to one embodiment, all of the rising pulse generators in the edge extracting unit 210 have this configuration and all the falling pulse generators, except for having an inversion driver instead of the driver DRV, have the same configuration.

Figure 7:
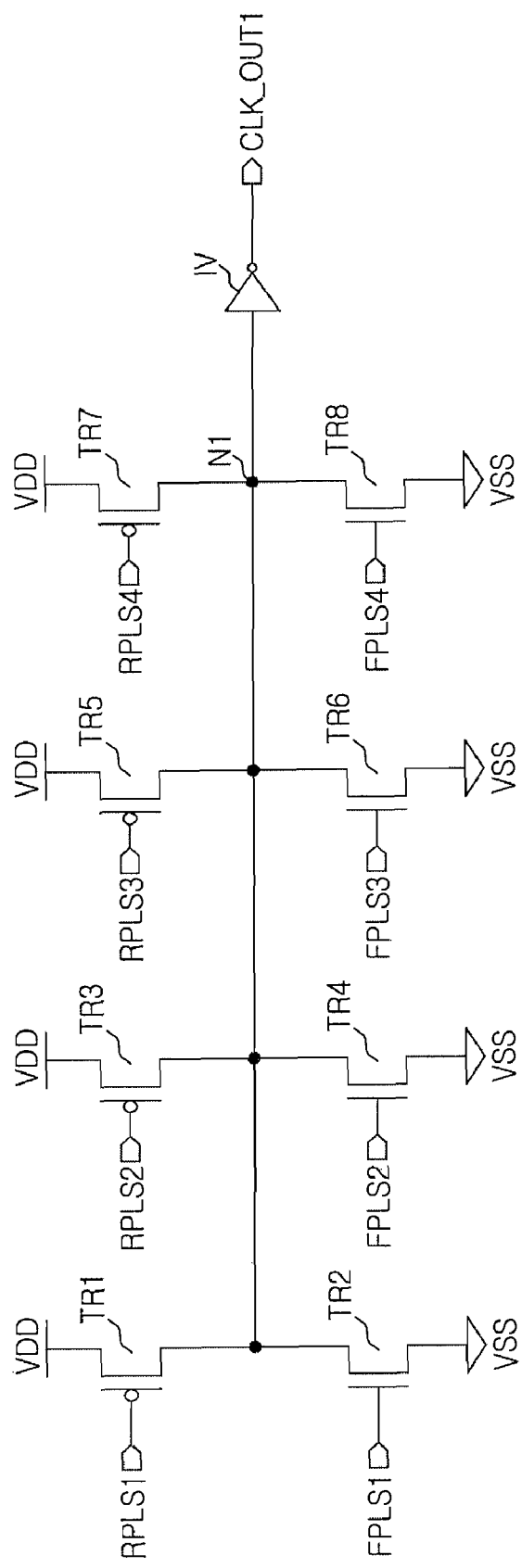
FIG. 7 is a diagram illustrating an exemplary configuration of the clock generator shown in FIG. 2.

FIG. 7 is a diagram illustrating an exemplary configuration of the clock generating unit shown in FIG. 2.

As illustrated in FIG. 7, the clock generating unit 220 may comprise: a first transistor TR1 of which the gate terminal may receive the first falling pulse signal FPLS1, the source terminal may be applied with external supply power VDD, and the drain terminal may be connected to a first node N1; a second transistor TR2 of which the gate terminal may receive the first rising pulse signal RPLS1, the drain terminal may be connected to the first node N1, and the source terminal may be grounded; a third transistor TR3 of which the gate terminal may receive the second falling pulse signal FPLS2, the source terminal may be applied with an external supply power VDD, and the drain terminal may be connected to the first node N1; a fourth transistor TR4 of which the gate terminal may receive the second rising pulse signal RPLS2, the drain terminal may be connected to the first node N1, and the source terminal may be grounded; a fifth transistor TR5 of which the gate terminal may receive the third falling pulse signal FPLS3, the source terminal may be applied with an external supply power VDD, and the drain terminal may be connected to the first node N1; a sixth transistor TR6 of which the gate terminal may receive the third rising pulse signal RPLS3, the drain terminal may be connected to the first node N1, and the source terminal may be grounded; a seventh transistor TR7 of which the gate terminal may receive the fourth falling pulse signal FPLS4, a source terminal may be applied with an external supply power VDD, and the drain terminal may be connected to the first node N1; an eighth transistor TR8 of which the gate terminal may receive the fourth rising pulse signal RPLS4, the drain terminal may be connected to the first node N1, and the source terminal may be grounded; and an inverter IV that may receive a potential generated at the first node N1 and may output the first output clock CLK_OUT1.

In this embodiment, the clock generating unit 220 generates a rising edge of the first output clock CLK_OUT1 when any one of the first to fourth rising pulse signals RPLS1 to RPLS4 is toggled, and generates a falling edge of the first output clock CLK_OUT1 when any one of the first to fourth falling pulse signals FPLS1 to FPLS4 is toggled. Therefore, the frequency of the first output clock CLK_OUT1 is determined in accordance with the toggle timings of the pulses included in the first to fourth rising pulse signals RPLS1 to RPLS4 and the first to fourth falling pulse signals FPLS1 to FPLS4.

Figure 8:
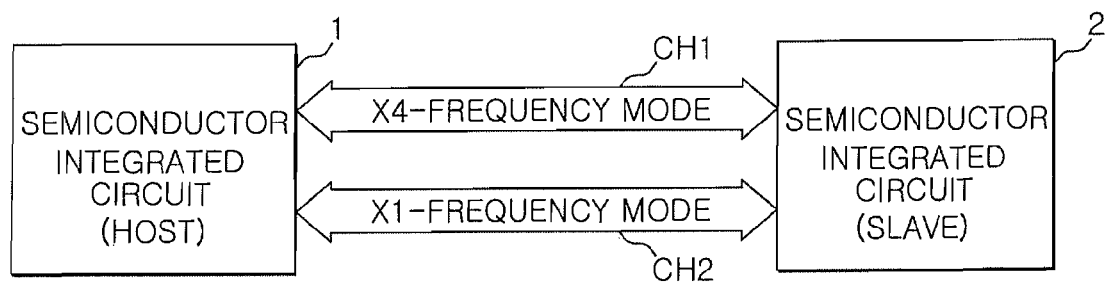
FIG. 8 is a diagram illustrating an exemplary arrangement of a semiconductor integrated circuit according to an embodiment of the present invention.

FIG. 8 is a diagram showing an example of an arrangement of semiconductor integrated circuits according to an embodiment of the present invention.

As shown in FIG. 8, two channels CH1 and CH2 may be provided between two semiconductor integrated circuits 1 and 2 and data is communicated through the channels CH1 and CH2. In this embodiment, if the semiconductor integrated circuits 1 and 2 are provided with a device for generating a clock of the present invention, as shown in FIG. 8, it is possible to achieve an operation making one channel CH1 implement the X4-frequency mode and the other channel CH2 implement the X1-frequency mode. As shown in FIG. 8, the two semiconductor integrated circuits 1 and 2 may be, for example, a host and a slave.

As described above, since a device for generating a clock in a semiconductor integrated circuit of the present invention can generate clocks having different frequencies with only one clock generator, it is possible to prevent the decrease of area margin and the increase of power consumption by implementing the present invention. Further, it becomes possible to lower the frequency of an output clock without changing the frequency of internal clocks generated by the clock generator, and accordingly, it becomes possible to generate clocks having various frequencies regardless of the limit in frequency of the internal clock.

Throughout the description, including in the claims, the term "comprising a" should be understood as being synonymous with the term "comprising at least one" unless otherwise specified to the contrary.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A device for generating a clock in a semiconductor integrated circuit, the device comprising:
    a multi-phase clock generator configured to generate a multi-phase internal clock;
    a first edge combining unit configured to generate a first output clock having a first frequency by combining rising edges of clocks included in the internal clock, and transmit the first output clock to a first port; and
    a second edge combing unit configured to generate a second output clock having a second frequency by combining rising edges of clocks included in the internal clock, and transmit the second output clock to a second port,
    wherein the first edge combining unit is configured to extract a predetermined number of clocks, which is defined in accordance with a frequency mode, among the clocks included in the internal clock, and generate the first output clock by combining the rising edges of the extracted clocks.

2. The device according to claim 1, wherein the first edge combining unit comprises:
    an edge extracting unit configured to extract the rising edges of a predetermined number of clocks, which is defined in accordance with the frequency mode, among the clocks included in the internal clock, and generate a plurality of rising pulse signals and a plurality of falling pulse signals; and
    a clock generating unit configured to generate the first output clock in response to the plurality of rising pulse signals and the plurality of falling pulse signals.

3. The device according to claim 2, wherein the edge extracting unit is configured to activate a same number of rising pulse signals and falling pulse signals as the number of clocks determined in accordance with the frequency mode in the clocks included in the internal clock such that the activated rising pulse signals and the falling pulse signals are alternately toggled with a timing difference corresponding to the frequency mode, in the plurality of rising pulse signals and the plurality of falling pulse signals.

4. The device according to claim 2, wherein the clock generating unit is configured to generate a rising edge of the first output clock, when any one of the plurality of rising pulse signals is toggled, and generate a falling edge of the first output clock, when any one of the plurality of falling pulse signals is toggled.

5. A device for generating a clock in a semiconductor integrated circuit, the device comprising:
    a multi-phase clock generator configured to generate a multi-phase internal clock;
    a first edge combining unit configured to generate a first output clock having a first frequency by combining rising edges of clocks included in the internal clock, and transmit the first output clock to a first port; and
    a second edge combing unit configured to generate a second output clock having a second frequency by combining rising edges of clocks included in the internal clock, and transmit the second output clock to a second port,
    wherein the second edge combining unit is configured to extract a predetermined number of clocks, which is defined in accordance with a frequency mode, among the clocks included in the internal clock, and generate the second output clock by combining the rising edges of the extracted clocks.

6. The device according to claim 5, wherein the second edge combining unit comprises:
    an edge extracting unit configured to extract the rising edges of a predetermined number of clocks, which is defined in accordance with the frequency mode, among the clocks included in the internal clock, and generate a plurality of rising pulse signals and a plurality of falling pulse signals; and
    a clock generating unit configured to generate the second output clock in response to the plurality of rising pulse signals and the plurality of falling pulse signals.

7. The device according to claim 6, wherein the edge extracting unit is configured to activate a same number of rising pulse signals and falling pulse signals as the number of clocks determined in accordance with the frequency mode in the clocks included in the internal clock such that the activated rising pulse signals and the falling pulse signals are alternately toggled with a timing difference corresponding to the frequency mode, in the plurality of rising pulse signals and the plurality of falling pulse signals.

8. The device according to claim 6, wherein the clock generating unit is configured to generate a rising edge of the second output clock, when any one of the plurality of rising pulse signals is toggled, and generate a falling edge of the second output clock, when any one of the plurality of falling pulse signals is toggled.

9. A device for generating a clock in a semiconductor integrated circuit, the device comprising:
    a rising pulse extracting unit configured to generate a plurality of rising pulse extraction signals toggled to a predetermined level at the rising edges of a portion of pre-assigned clocks among clocks included in a multi-phase internal clock;
    a falling pulse extracting unit configured to generate a plurality of falling pulse extraction signals toggled to a low level at the rising edge of a portion of pre-assigned clocks among clocks included in the multi-phase internal clock;
    a MUX unit configured to generate a plurality of rising pulse signals and a plurality of falling pulse signals by combining the plurality of rising pulse extraction signals and the plurality of falling pulse extraction signals; and
    a clock generating unit configured to generate an output clock in response to the plurality of rising pulse signals and the plurality of falling pulse signals.

10. The device according to claim 9, wherein the rising pulse extracting unit is configured to generate the plurality of rising pulse extraction signals by extracting the rising edges of the odd-numbered clocks from the first to N-th clocks included in the multi-phase internal clocks (N is 2 or an even number above 2).

11. The device according to claim 9, wherein the falling pulse extracting unit is configured to generate the plurality of falling pulse extraction signals by extracting the rising edges of the other clocks, except for the first clock from the first to N-th clocks included in the multi-phase internal clocks (N is 2 or an even number above 2).

12. The device according to claim 9, wherein the MUX unit is configured to output signals predetermined in accordance with a frequency mode in the plurality of rising pulse extraction signals, as the plurality of rising pulse signals, and output signals predetermined in accordance with the frequency mode in the plurality of falling pulse extraction signals, as the plurality of falling pulse signals.

13. The device according to claim 9, wherein the clock generating unit is configured to generate a rising edge of the output clock, when any one of the plurality of rising pulse signals is toggled, and generate a falling edge of the output clock, when any one of the plurality of falling pulse signals is toggled.

* * * * *